United States Patent [19]

Minakuchi et al.

[11] 4,393,514
[45] Jul. 12, 1983

[54] SUPERREGENERATIVE RECEIVER

[75] Inventors: Yoshikazu Minakuchi, Neyagawa; Toshio Abiko, Ibaragi; Hiromitsu Inoue, Soraku, all of Japan

[73] Assignee: Matsushita Electric Works, Ltd., Osaka, Japan

[21] Appl. No.: 215,355

[22] Filed: Dec. 11, 1980

[30] Foreign Application Priority Data

Dec. 15, 1979 [JP] Japan .................. 54-163078

[51] Int. Cl.³ .......................... H04B 1/16
[52] U.S. Cl. ..................... 455/336; 455/215
[58] Field of Search ............. 455/215, 336; 329/170

[56] References Cited

U.S. PATENT DOCUMENTS 2,513,968  7/1950  Riebman ............... 455/336
3,054,056  9/1962  Yost, Jr. ............... 455/336
3,337,807  8/1967  Brown ................. 455/336

Primary Examiner—Jin F. Ng
Attorney, Agent, or Firm—Birch, Stewart, Kolasch & Birch

[57] ABSTRACT

A superregenerative receiver includes a quenching oscillator for converting a received signal into a low frequency signal. The quenching oscillator comprises a transistor, a positive feedback circuit and an RC time constant circuit. A circuit is provided for modifying oscillation conditions including the base voltage of the transistor, a power supply voltage and the RC time constant of the RC circuit. In response to the output of the quenching oscillator whose oscillation condition or conditions have been modified, the quenching oscillator is placed into its optimum operating state in order that the receiver assumes substantially the maximum sensitivity.

9 Claims, 27 Drawing Figures

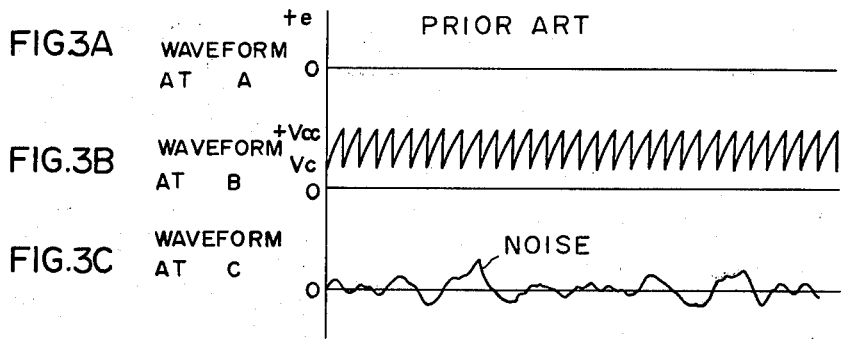
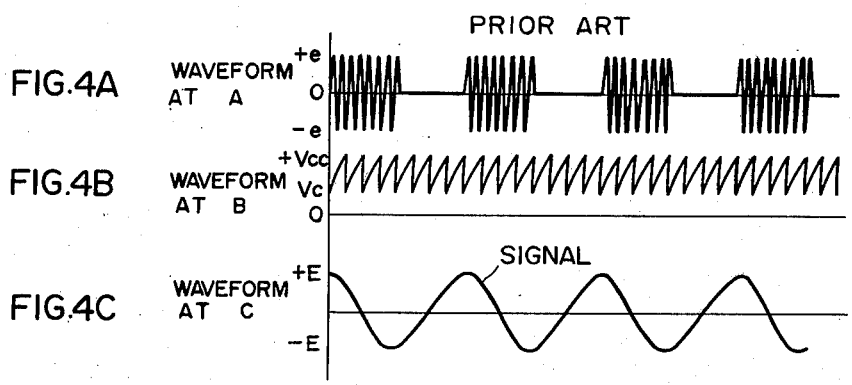
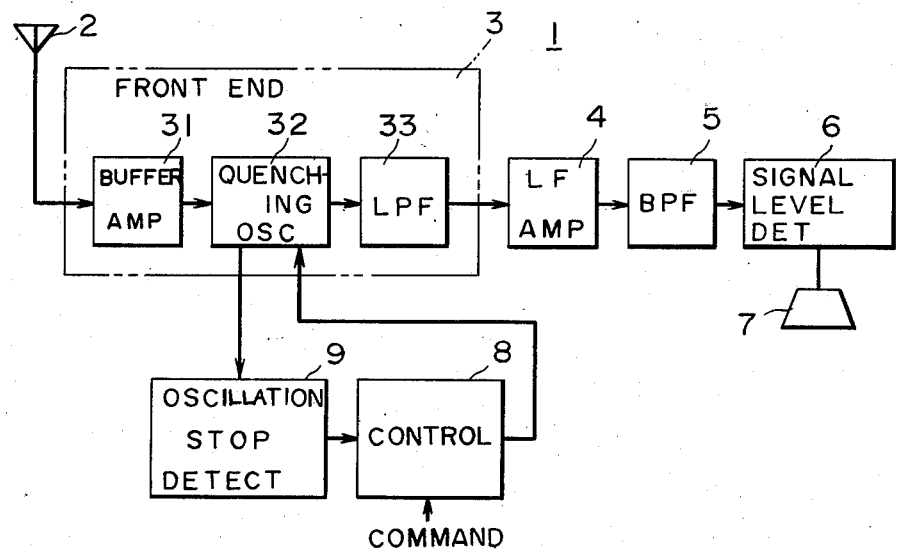

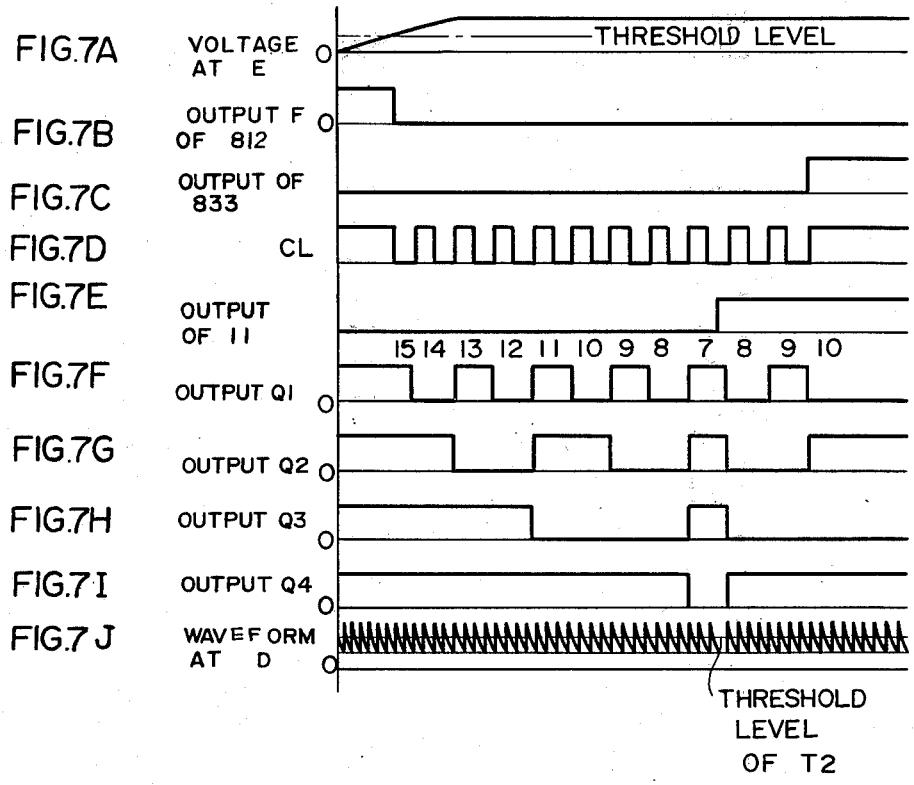
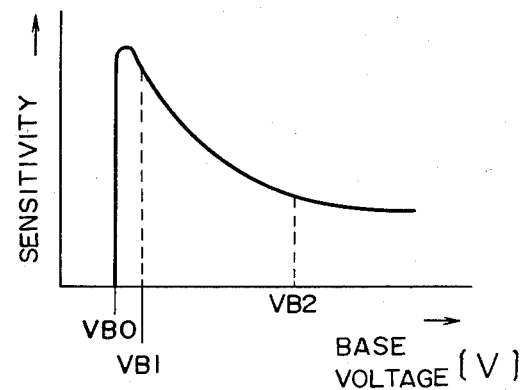
FIG.8

SUPERREGENERATIVE RECEIVER

BACKGROUND OF THE INVENTION

1. Field of the Invention

The present invention relates to a superregenerative receiver. More specifically, the present invention relates to an improved superregenerative receiver for use in wireless receivers of a remote control system, citizen band receivers and the like.

2. Description of the Prior Art

A prior art superregenerative receiver is illustrated in a block diagram of FIG. 1. The superregenerative receiver is generally designated by the reference numeral 1 in FIG. 1. The superregenerative receiver 1 includes an antenna 2 and a front end 3 having a superregenerative detector responsive to an incoming signal received at the antenna 2. The front end 3 comprises a buffer amplifier 31 for amplifying the received signal, a quenching oscillator 32 and a low-pass filter 33. As is well-known in the art, the quenching oscillator 32 also serves as a detector and the output of the quenching oscillator 32 is derived as a low frequency signal through the low-pass filter 33. The low frequency signal from the low-pass filter 33 is then fed to a signal level detector 6 through a low frequency amplifier 4 and a bandpass filter 5. When the resultant low frequency signal is above a given level, the signal level detector 6 energizes a buzzer 7. The buzzer 7 thus provides an audible indication that the signal has been introduced into the receiver 1.

The prior art front end 3 will now be described in more detail by reference to FIGS. 2 to 4. The reference numerals 31, 32 and 33 in FIG. 2 represent the buffer amplifier, the quenching oscillator and the low-pass filter, respectively, in the same manner as in FIG. 1. The buffer amplifier 31 includes a transistor T1 which builds up a tuned amplifier of a base-grounded type. The transistor T1 is connected to a power line 30 leading to a power supply +V through a tuning circuit 311 and a resistor. The tuning circuit 311 includes a parallel circuit of an inductor L1 and a capacitor C1 with its tuning frequency in agreement with the carrier frequency of the incoming signal. The incoming signal is received by the antenna 2 (FIG. 1) and fed to the amplifier or the transistor T1 via a terminal A and a coupling capacitor C2. The output of the tuning circuit or a resonance circuit 311 is coupled via the coupling capacitor C3 with the collector of a transistor T2 which constitutes the quenching oscillator 32. The collector of the transistor T2 is connected to the power line 30 via a tuning circuit 321 and an integration circuit 322. The tuning circuit 321 comprises a parallel combination of an inductor L2, a capacitor C4 and a trimmer capacitor C5, while the integration circuit 322 comprises a resistor R1 and a capacitor C6. Connected between the collector and emitter of a transistor T2 is a capacitor C7 which establishes a positive feedback loop therebetween. The base of the transistor T2 is supplied with a base bias voltage which is derived by dividing the power supply voltage +V with a pair of resistors R2 and R3. An oscillating inductor L3 and a parallel circuit of a resistor R4 and a capacitor C8 are connected in series between the emitter of the transistor T2 and the ground. The output of the quenching oscillator 32 is derived from the series junction B of the tuning circuit 321 with the integration circuit 322 to an output terminal C through the low-pass filter 33. The operating principle of the quenching oscillator 32 will be discussed below.

In other words, the quenching oscillator 32 operates in the following manner. Assume now that the transistor T2 is in transition from its conductive state to its non-conductive state. Under the circumstance the collector voltage of the transistor T2 increases gradually according to the charging time constant of the integration circuit 322 as determined by the capacitor C6 and the resistor R1. The varying collector voltage of the transistor T2 is fed to its emitter via the capacitor C7. If the collector voltage reaches its maximum i.e. if current flowing through the oscillating inductor L3 is reduced to a minimum, then the base of the transistor T2 is supplied with the bias voltage in a sense to turn that transistor T2 conductive by virtue of counterelectromotive force developed by the oscillating inductor L3. The transistor T2 therefore becomes conductive abruptly. Once the transistor T2 has become conductive, the oscillating inductor L3 causes counterelectromotive force to render the transistor T2 non-conductive. For this reason the transistor T2 becomes non-conductive and the collector voltage of the transistor T2 rises gradually by the action of the integration circuit 322. In this manner, the transistor T2 is repeatedly switched between the conductive and non-conductive states so as to initiate oscillation. In response to the switching of the transistor T2 between the conductive and non-conductive states, the tuning circuit 321 produces a transient variation in voltage and current. Under these circumstances, the output of the buffer amplifier 31 is applied to the tuning circuit 321 to perform a sort of mixing operation. A modulated signal originating from this mixing operation is supplied via the junction B to the low-pass filter 33.

FIG. 3 shows the waveforms of voltages appearing at the respective nodes A, B and C in FIG. 2 in the absence of the incoming signal and FIG. 4 shows the same in the presence of the incoming signal. It is clear from FIG. 3 that, when no incoming signal is received, only a noise component appears at the output terminal C of the low-pass filter 33 and the bandpass filter 5 (FIG. 1) removes such noise component. At this moment, the buzzer 7 is never enabled with the signal level detector 6.

If an incoming signal is received by the antenna 2, then the incoming signal is admitted to the buffer amplifier 31 in the form of a waveform of FIG. 4A. The voltage level of the received signal is amplified by the buffer amplifier 31 and supplied to the quenching oscillator 32. The quenching oscillator 32 develops its oscillation output voltage as indicated in FIG. 4B. Within the quenching oscillator 32 the received signal is mixed into the resultant oscillation signal and the low frequency signal of FIG. 4C is delivered through the output terminal C of the low-pass filter 33. The low frequency signal is then fed to the signal level detector 6 through the amplifier 4 and the bandpass filter 5 (FIG. 1).

It is generally known in the above described type of superregenerative receiver that sensitivity is under the influence of the oscillation output voltage and the oscillation frequency of the quenching oscillator. With the maximum of the output voltage of the quenching oscillator and the minimum of the frequency of the output thereof, the sensitivity of the receiver is also the maximum. Attention should be paid in this respect at the stage of design of the receiver and the base voltage of the transistor or other factors are selected such that the quenching oscillator provides its maximum output voltage and its minimum frequency. For example, while considering the base voltage of the transistor, there is a very small difference between the maximum voltage (e.g., VB1) at which the maximum output voltage of the oscillator is available and the minimum base voltage (e.g., VB0) at which the oscillator fails to operate. Thus, in the event that the base voltage is selected to be VB1 at the stage of design, there is a possibility that the base voltage will decrease below VB0 due to variations in an ambient temperature, circuit components or power supply voltages. As a matter of fact, the prior art superregenerative receiver is designed with a decrease in sensitivity to the extent that it can provide a stable output despite fluctuations in the abovementioned factors. The prior art superregenerative receiver is therefore unable to make the best of the fact that it essentially exhibits a high sensitivity.

SUMMARY OF THE INVENTION

In summary, the present invention provides a superregenerative receiver wherein at least one oscillation condition of a quenching oscillator is modified or altered into its optimum value in response to the instantaneous output of the oscillator in order to insure substantially maximum sensitivity. The superregenerative receiver embodying the present invention is able to provide constantly stable receiver performance with substantially the maximum sensitivity despite variations in power supply voltages, ambient temperature and circuit components.

In accordance with a preferred embodiment of the present invention, there is provided means for providing a command which activates means for setting the optimum oscillation condition. The means for setting the optimum oscillation setting condition is thus activated upon the development of the command from said command means. The command means may comprises manually operable switching means.

In accordance with an alternative preferred embodiment of the present invention, the quenching oscillator discontinues operation responsive to modification of the oscillation condition and means for setting the optimum oscillation condition is activated once the oscillation operation has been stopped. In this embodiment, the optimum oscillation condition can be easily established depending upon the peculiar property of the quenching oscillator that the optimum oscillation condition at which the maximum sensitivity is ensured is located very closely to the condition where it discontinues oscillation.

A specific example of the oscillation condition in the present invention may be an operating voltage (for example, a power supply voltage or the like) for the quenching oscillator. Another example of the oscillation condition useful for the purpose of the present invention may include at least either an operating voltage or an operating current for a gain element included in the quenching oscillator. The quenching oscillator may further include a circuit component for determining its oscillation frequency. Still another example of the quenching oscillator may include a specific value in such a circuit component.

Accordingly, it is a principal object of the present invention to provide an improvement in a superregenerative receiver which ensures stable performance substantially at the maximum sensitivity in spite of fluctuations in power supply voltages and ambient temperature.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 3 (3A-3C) and 4 (4A-4C) are voltage waveform diagrams for explanation of operation of the circuit of FIG. 2;

FIG. 5 is a schematic block diagram showing an embodiment of the present invention;

FIG. 7 (A-J) is a waveform diagram for explanation of operation of the embodiment shown in FIG. 6;

FIG. 8 is a graph for explanation of operation of the embodiment of FIG. 6 with abscissa indicating base voltage and ordinate indicating sensitivity;

DETAILED DESCRIPTION OF THE PREFERRED EMBODIMENTS

Figure 1:
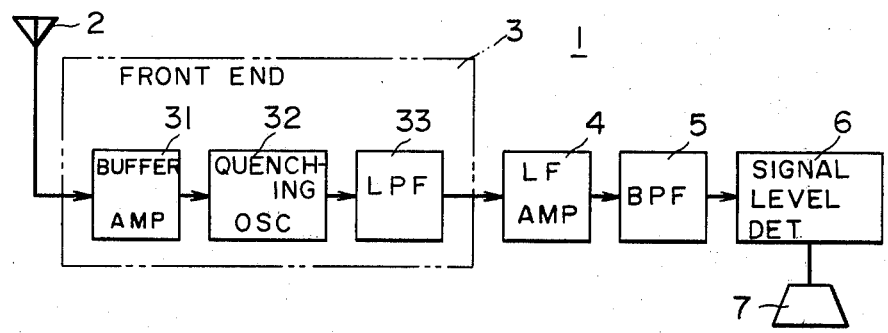
FIG. 1 is a schematic block diagram of a prior art superregenerative receiver.
Figure 2:
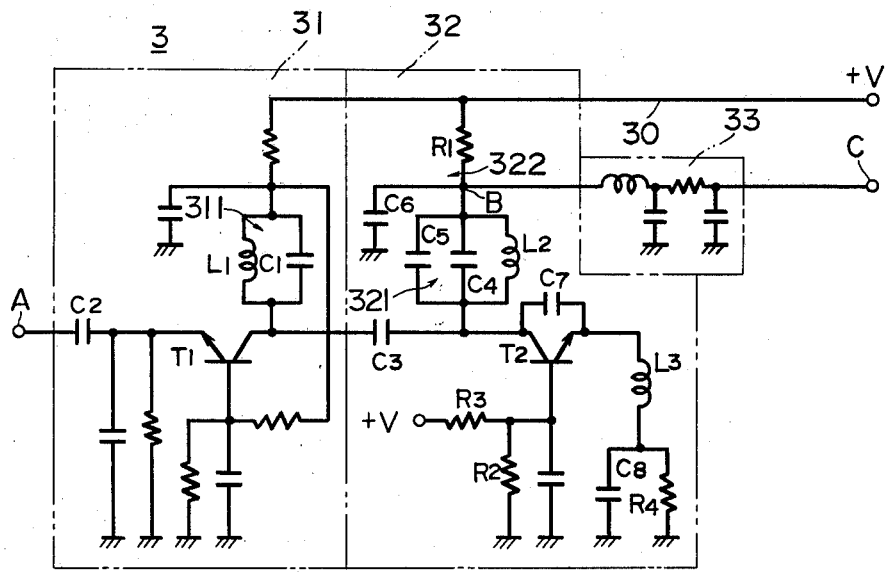
FIG. 2 is a circuit diagram of a specific example of a front end.

Reference is now made to FIG. 5 which is a schematic block diagram of an embodiment of the present invention. In FIG. 5, similar components are designated by the same reference numerals as in FIG. 1 whatever possible, with its descriptions omitted herein. In the embodiment of FIG. 5, the quenching oscillator 32 included in the front end 3 is connected to a control circuit 8. The control circuit 8 operates to modify or alter at least one oscillation condition of the quenching oscillator 32 (for example, a power supply voltage, other operating voltages or a circuit constant) pursuant to a command example, a power supply voltage, applied thereto. The quenching oscillator 32 is further connected to an oscillation stop detector 9 which determines if the quenching oscillator 32 ceases oscillating when the control circuit 8 is in the course of varing the oscillation condition of the quenching oscillator 32 in issue. The oscillation stop detector 9 provides its output to the control circuit 8. The control circuit 8, therefore, establishes the optimum oscillation condition which permits stable and maximum sensitivity performance of the quenching oscillator 32. In this embodiment, upon application of the command to the control circuit 8, the quenching oscillator 32 is placed into its optimum oscillation state.

It is noted that the embodiment of FIG. 5 is adapted such that the control circuit 8 places the quenching oscillator 8 into its optimum oscillation condition in response to the output of the oscillation stop detector 9. It is understood that the oscillation stop detector 9 is only a specific measure of detecting the output of the quenching oscillator. This circuit 9 may be replaced with a circuit which senses if the quenching oscillator 32 starts oscillating, a circuit which monitors the oscillation frequency of the quenching oscillator or any other circuit. It is obvious to those skilled in the art that such modifications and changes may be readily made from a consideration of embodiments fully discussed in the following description.

Figure 6:
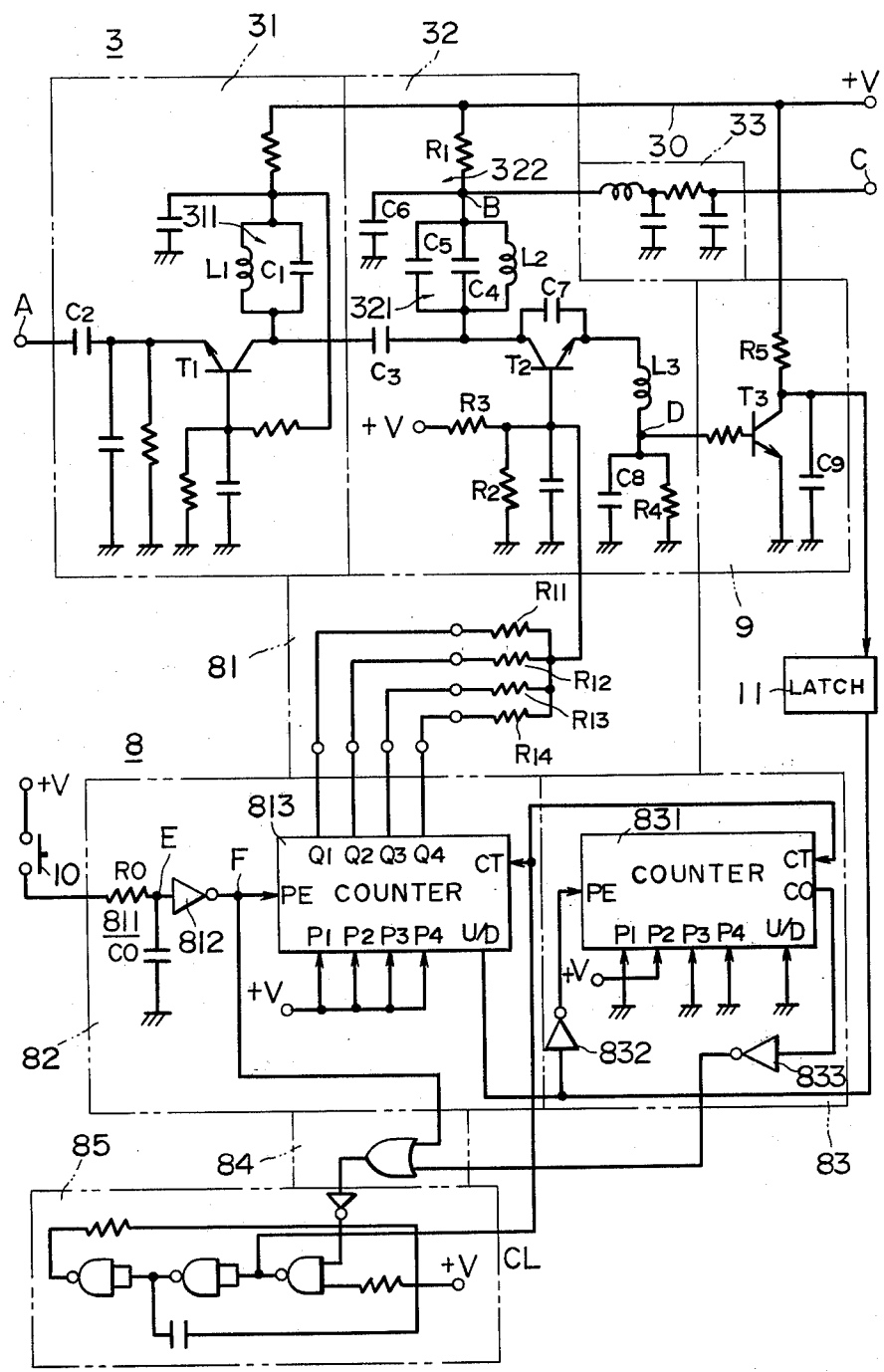
FIG. 6 is a circuit diagram of a major portion of a preferred embodiment of the present invention pursuant to the scheme of FIG. 5.

FIG. 6 is a circuit diagram of a major portion of a preferred embodiment of the present invention wherein similar components are designated by the same reference numerals as in FIG. 5. In the embodiment of FIG. 6, the control circuit 8 is connected to the base of the transistor T2 which forms the quenching oscillator 32. The oscillation stop detector 9 is connected to an end D of the inductor L3. The oscillation stop detector 9 includes a transistor T3 which is connected to the power line 30 through a resistor R5 and grounded through a capacitor C9. Developed at the collector of the transistor T3 is a signal whose level varies depending upon whether the quenching oscillator 32 is oscillating. More specifically, the transistor T3 is non-conductive when the quenching oscillator 32 provides no output. For this reason the capacitor C9 keeps being charged from the power line 30 via the resistor R5. The voltage across the capacitor C9 or the collector level of the transistor T3 is at a high level. On the other hand, when the quenching oscillator 32 produces its output, then the transistor T3 becomes conductive in response to the oscillator output. Once the transistor T3 has become conductive, the capacitor C9 is no longer supplied with charging current and begins discharging the charge accumulated thereon through the transistor T3. Accordingly, while the quenching oscillator 32 is oscillating, the collector of the transistor T3 or the output of the oscillation stop detector 9 is held at a low level.

The control circuit 8 generally includes a resistor network 81, a first control circuit 82, a second control circuit 83, a logic OR gate 84 and a clock generator 85. It is understood that the respective circuits 82, 83, 84 and 85 are also of use in the following embodiments. By way of example, the resistor network 81 comprises four resistors R1, R2, R3 and R4 each of which has one terminal commonly connected to the base of the transistor T2 in the quenching oscillator 32. The opposite terminals of these resistors R11 to R14 are individually connected to respective ones of outputs of a counter 813 in the first control circuit 82. An example of the command means may be a switch 10 which has one terminal connected to the power supply +V and the opposite terminal connected to an integration circuit 811 in the first control circuit 82. The integration circuit 811 includes a combination of a resistor R0 and a capacitor C0. The output of the integration circuit 811 is fed as a preset enable signal PE to the counter 813 through an inverter 812 and to an input to the two-input OR gate 84. The counter 813 may be implemented with a presettable up/down counter whose inputs P1, P2, P3 and P4 accept a preset value. The output of the above described oscillation stop detector 9 is supplied to a terminal U/D of the up/down counter 813 through a latch circuit 11 for selection of its increment mode or decrement mode. A count input CT of the counter 813 is supplied with clock pulses CL from the clock generator 85. The second control circuit 83 includes a counter 831 which may be implemented with a presettable down counter. It is noted that these counters 813 and 831 may be of any well-known component type, for example, an integrated circuit MC 14516 B manufactured by Motorola Inc. In FIG. 6, the remaining terminals of the counters 813 and 831 such as a carry signal input terminal and a reset terminals are omitted for the sake of simplicity only. As discussed previously, the output of the oscillation stop detector 9 is supplied as a preset enable signal PE to the counter 831 via an inverter 832. It is noted that both the counters 831 and 813 are loaded with the preset values P1 to P4 in synchronization with the application of the high level signal PE. The preset value is fed in parallel fashion via the input terminals P1, P2, P3 and P4 to the counter 831. A count input CT of the counter 831 is also supplied with the clock pulses CL from the clock generator 85. A carry-out signal CO from the counter 831 is applied to the other input of the two-input OR gate 84 through an inverter 833. The output of the OR gate 84 is provided as an enabling signal for the clock generator 85. In other words, the clock generator 85 is disabled and enabled when the output of the OR gate 84 is at a high level and at a low level, respectively.

In summary, when the switch 10 is turned on in the embodiment of FIG. 6, the resistors R11 to R14 connected to the base of the transistor T2 are selectively connected to the power supply +V and/or to the ground potential, thus varying the base voltage of the transistor T2. In response to the signal from the oscillation stop detector 9, the resistors R11 to R14 are connected to the power supply +V and/or to the ground level so as to attain the optimum base voltage. The relationship between the base voltage of the transistor T2 and the sensitivity of the receiver 1 is depicted in FIG. 8, for example. It is obvious from FIG. 8 that the quenching oscillator 32 discontinues oscillation when the base potential of the transistor T2 in the quenching oscillator 32 falls below VB0. With a base potential slightly higher than the oscillation stop level VB0, the sensitivity of the receiver is the maximum. It is understood that the optimum base voltage is decided to be VB1 in consideration of stability. In the embodiment of FIG. 6, the switch 10 in a conductive position permits the base voltage to vary gradually and the optimum base voltage VB1 to be applied to the transistor T2 at the point in time where the quenching oscillator 32 is disabled.

Operation of the embodiment of FIG. 6 will be more fully understood from a consideration of FIGS. 7 and 8. When the switch 10 of FIG. 6 is turned on, the integration circuit 811 demonstrates a continued, gradual increase in output voltage as indicated in FIG. 7A depending upon the charging time constant which is defined by the resistor R0 and the capacitor C0. If the voltage appearing at the output node E of the integration circuit 811 is lower than the threshold level of the inverter 812, then the output of the inverter 812 or the voltage appearing at the joint F is held at a high level as shown in FIG. 7B. Since the quenching oscillator 32, on the other hand, is in operation under these circumstances, the output of the oscillation stop detector 9 remains at a low level. The result is that the output of the inverter 832 assumes a high level. The presettable counters 813 and 831 are both supplied with the signal PE of a high level and loaded with the preset value. However, the counters 813 and 831 cannot start counting because the clock generator 85 has not yet been activated.

The voltage at the integration circuit 811 further continues increasing and eventually reaches the threshold level of the inverter 812 as illustrated in FIG. 7A. Then, the output of the inverter 812 or the voltage at the junction F falls to a low level as seen from FIG. 7B. With the output of the inverter 812 at the low level, the carry-out signal CO at the counter 831 assumes a high level and the output of the inverter 833 assumes a low level, resulting in a low level at the output of the OR gate 84. Once the output of the inverter 812 has fallen to the low level, the clock generator 85 starts developing the clock pulse CL.

The signal PE to the presettable up/down counter 813, on the other hand, assumes a low level upon such decrease in the output of the inverter 812. The counter 813 therefore becomes operable to count. More particularly, the counter 813 starts decrementing from the preset value supplied via the inputs P1 to P4 in response to the clock pulses CL. Since the inputs P1 to P4 are all at a high level in the given example, the counter 813 shows "1111" or a numerical value "15". At the moment where the counter 813 is enabled, the outputs Q1 to Q4 of the counter 813 are all held at the high level as seen from FIGS. 7F to 7I. This leads to that the respective ones of the resistors R11 to R14 in the resistor network 81 connected to the outputs Q1 to Q4 are pulled up to a high voltage +V. As a result, the base voltage of the transistor T2 in the quenching oscillator 32 is set at VB2 as shown in FIG. 8. It is understood that the base voltage of the transistor T2 is set at VB0 as depicted in FIG. 8 when the count value in the counter 813 is "7" i.e. when only the output Q4 of the counter 13 is at a low level. Furthermore, VB1 in FIG. 8 is developed when the outputs Q2 and Q4 of the counter 813 are at the high level and the remaining outputs Q1 and Q3 at the low level and in other words when the count value in the counter 813 is "10". The counter 831, on the other hand, has not been activated yet. This is due to the fact that the output of the oscillation stop detector 9 is at the low level and the signal PE remains at the high level.

The output of the oscillation stop detector 9 places the up/down counter 813 into its decrement mode. Upon the subsequent development of the clock pulse CL from the clock generator 85 as seen from FIG. 7D the counter 813 is decremented each time the clock pulse CL is supplied thereto. Consequently, the base voltage of the transistor T2 varies from VB2 up to VB0 as seen from FIG. 8.

When the count value in the counter 813 amounts to "7", the base voltage of the transistor T2 is equivalent to VB0 in FIG. 8. Under these circumstances the quenching oscillator 32 ceases oscillating. The oscillation stop detector 9 provides its output of the high level and thus an output of the latch circuit 11 becomes also the high level as indicated in FIG. 7E. Thus, the output of the inverter 832 in the second control circuit 83 decreases to the low level, activating the presettable down counter 831. In the given example, the preset value in the counter 831 is defined by the input P2 at the high level and the remaining inputs P1, P3 and P4 at the low level so that the counter 831 has "0010" or a numerical value "2". At this time the counter 831 is in its decrement mode. The other up/down counter 813 is brought into its increment mode in response to the output of the oscillation stop detector 9.

In this way, the up/down counter 813 is placed into its increment mode and the counter 831 into its decrement mode. Whenever the clock pulse CL is applied the counter 831 is decremented toward "0". When the counter 831 reaches "0", the carry-out signal CO of the counter 831 falls to the low level and the output of the inverter 833 rises to the high level. Therefore, the clock generator 85 no longer generates the clock pulse CL. The up/down counter 813 shows a count "10" wherein the outputs Q2 and Q4 are at the high level and the remaining outputs Q1 and Q3 are at the low level. As stated previously, the base voltage of the transistor T2 settles down to VB1 in FIG. 8. The base voltage VB1 is the optimum base voltage at which the receiver 1 operates substantially at the maximum sensitivity with stability.

Figure 9:
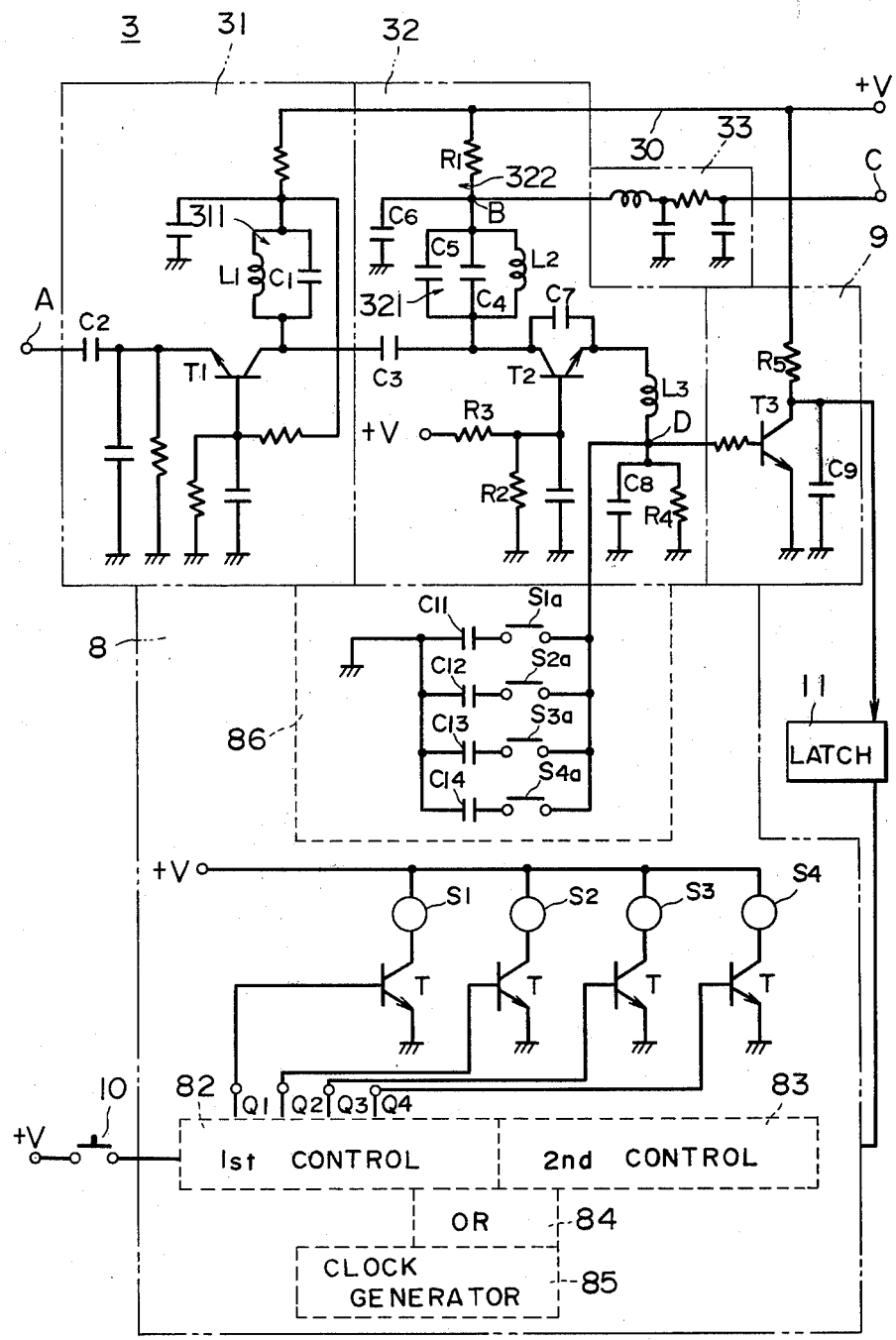
FIG. 9 is a circuit diagram of a major portion of another preferred embodiment of the present invention.
Figure 11:
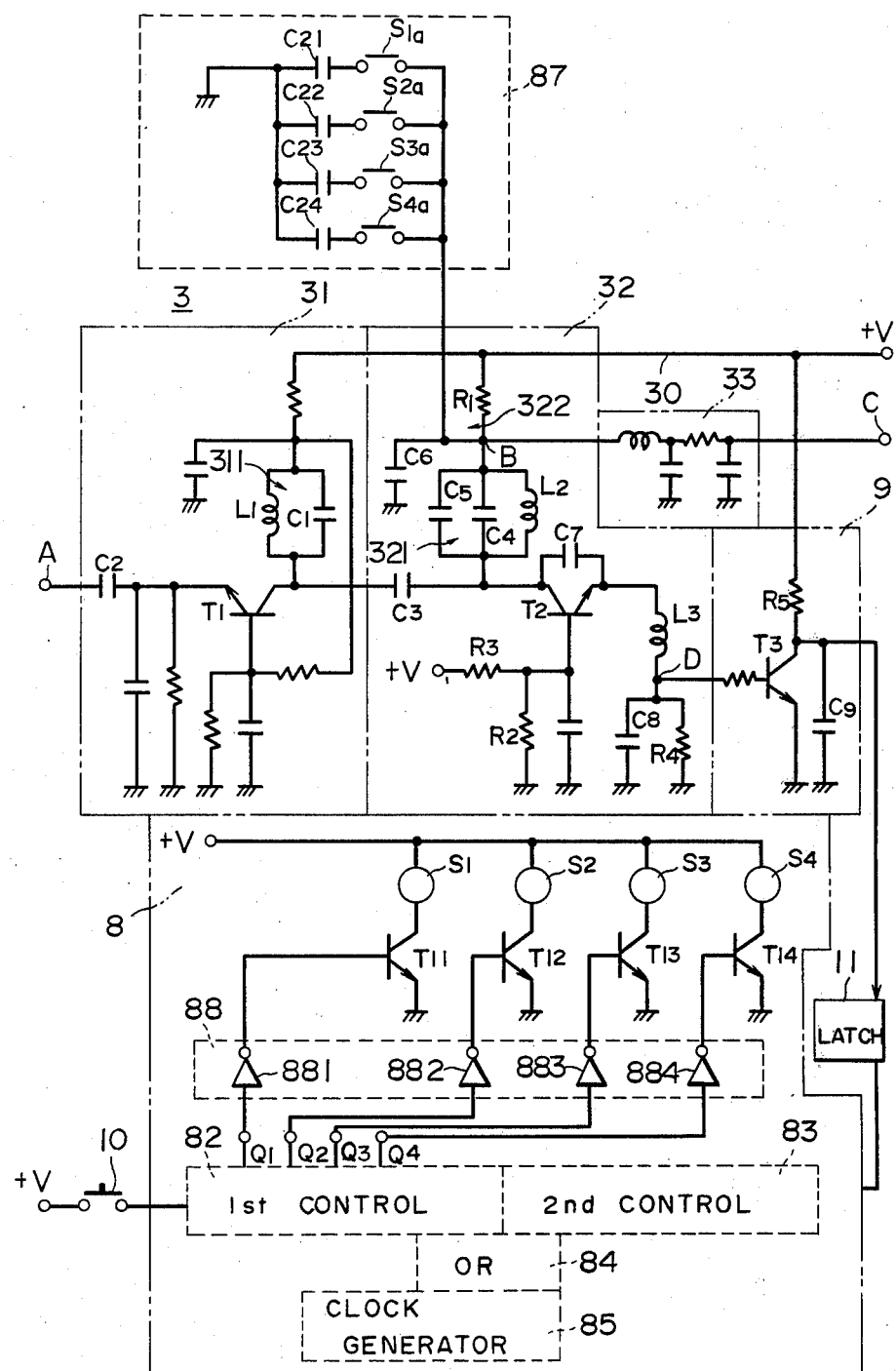
FIG. 11 is a circuit diagram of a major portion of still another preferred embodiment of the present invention.
Figure 13:
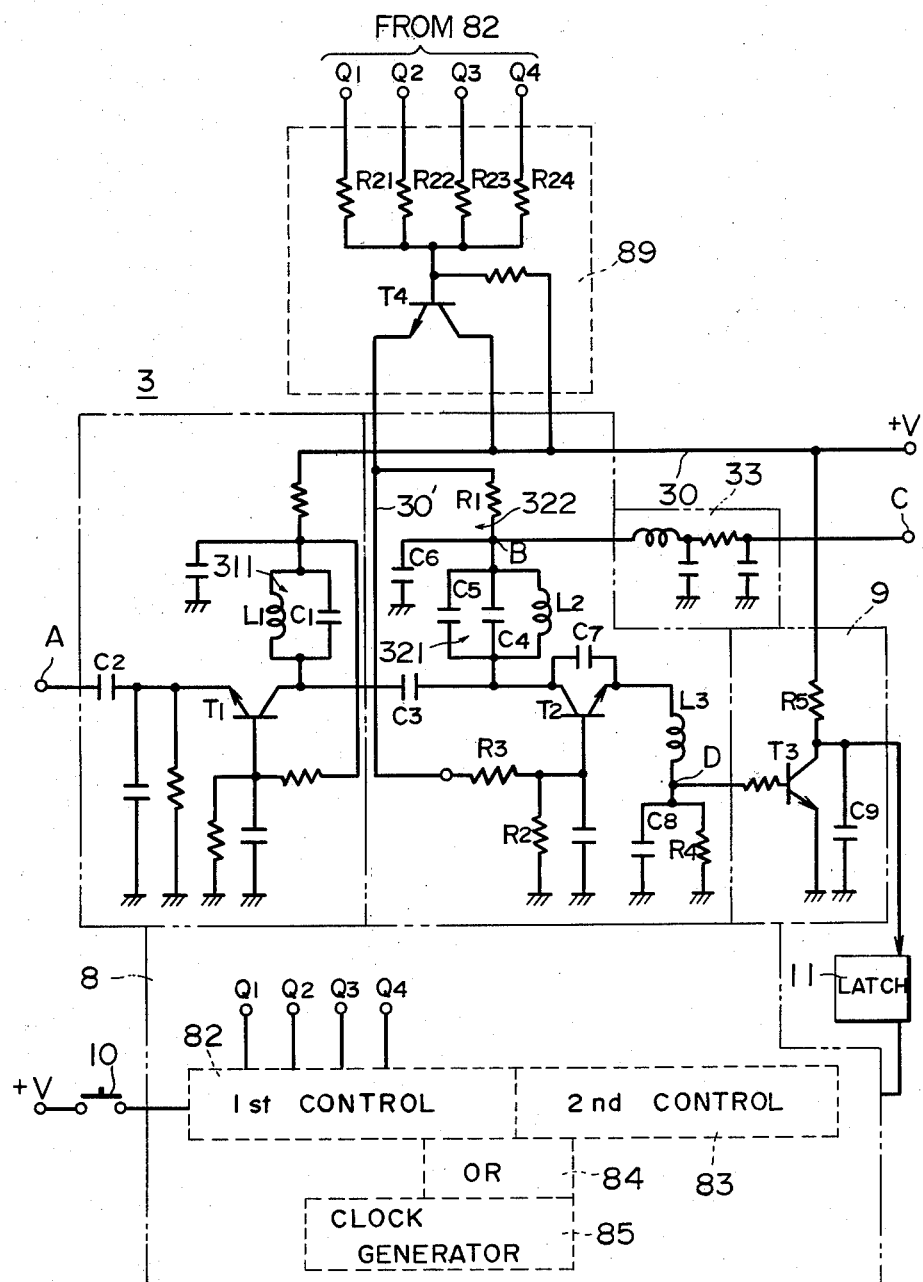
FIG. 13 is a circuit diagram of a major portion of another preferred embodiment of the present invention.

A latch circuit 11 is provided in the embodiment of FIg. 6 as well as in other alternative embodiments of FIGS. 9, 11 and 13, which circuit receives the output of the oscillation stop detector 9 and conducts its latch operation to latch its output at the high level upon transition of the output of the detector from the low level to the high level. The latch circuit 11 prevents malfunction of the counter 831 in the second control circuit 83 due to the output of the detector 9. More specifically, although the output of the detector 9 assumes either the low level or the high level depending upon whether the quenching oscillator 32 is oscillating, there is likelihood that the counter 831 will restart its counting operation and destroy the optimum oscillation condition if the output of the circuit 9 decreases to the low level after the development of the carry-out signal CO. The latch circuit 11 prevents such malfunction.

FIG. 9 is a circuit diagram of a major portion of another embodiment of the present invention. Whereas in the previous embodiment of FIG. 6 the base voltage of the transistor T2 is varied toward the optimum base voltage, the embodiment of FIG. 9 is adapted to optimize the time constant of the capacitor C8 and the resistor R4 which are determinative of the oscillation frequency of the quenching oscillator 32. Since the circuit blocks 82, 83, 84 and 85 are similar to those in the embodiment of FIG. 6, details of its illustrations and operations are omitted herein. A capacitor network 86 takes the place of the resistor network 81 in FIG. 6. The capacitor network 86 includes four capacitors C11 to C14, for example. Each of these capacitors C11 to C14 has one terminal commonly grounded and the opposite terminal connected to one of relay contacts S1a to S4a. The opposite terminal of each of the relay contacts S1a to S4a is commonly connected to the junction D of the quenching oscillator 32. These relay contacts S1a to S4a are activated by relay coils S1 to S4. The relays S1, S2, S3 and S4 are energized or disenergized by the outputs Q1, Q2, Q3 and Q4 of the counter 813 (FIG. 6), respectively. The respective outputs Q1 to Q4 from the first control circuit 82 are coupled with the bases of transistors T11 to R14. The relay coils S1 to S4 are respectively connected to the collectors of the transistors T11 to T14. It is obvious that the relay coils and their contacts may be replaced with well-known semiconductor switching elements.

Figure 10:
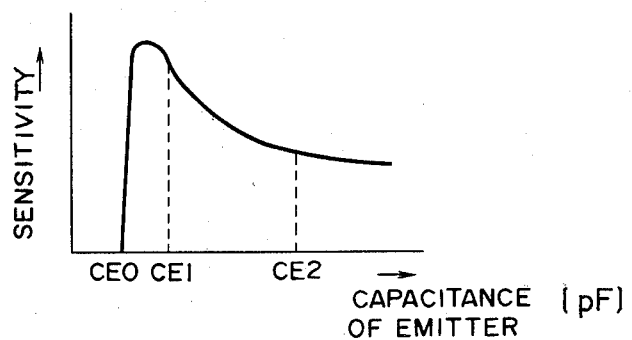
FIG. 10 is a graph for explanation of operation of the embodiment of FIG. 9 with the abscissa indicating emitter capacitance and the ordinate indicating sensitivity.

The term "emitter capacitance" of the transistor T2 is used to define a total of the capacitances of the capacitors C11 to C14 in the capacitor network 86 combined with the capacitor C8 in the quenching oscillator 32. The relationship between the emitter capacitance and the sensitivity of the receiver 1 is more fully seen from FIG. 10. When the emitter capacitance is CE0, the quenching oscillator 32 discontinues oscillating. With an emitter capacitance slightly higher than CE0, the receiver 1 exhibits the maximum sensitivity. It is thus concluded in view of stability that CE1 in FIG. 10 is the optimum emitter capacitance. In the embodiment of FIG. 9, the control circuit 8 including the above described capacitor network 86 automatically varies the "emitter capacitance" in an attempt to seek its optimum value. This embodiment operates substantially in the same manner as in the previous embodiment as shown in FIG. 6 with the exception that the relay contacts S1a to S4a serve to connect a selected one of the capacitors to the junction D. Further details of the embodiment of FIG. 9 are not discussed below.

The capacitance value associated with the junction D of the quenching oscillator 32 is varied with the sole object of varying the RC time constant at the emitter of the transistor T2. Although not shown, the capacitors C11 to C14 in the embodiment of FIG. 9 may be thus replaced with resistors.

Figure 12:
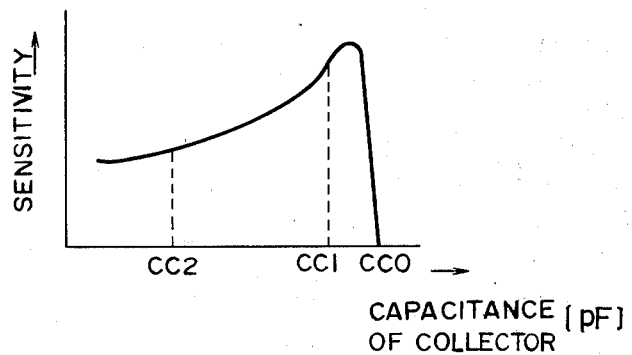
FIG. 12 is a graph for explanation of operation of the embodiment of FIG. 11 with the abscissa indicating collector capacitance and the ordinate indicating sensitivity.

Referring to FIG. 11, there is illustrated a circuit diagram of a major portion of yet another embodiment of the present invention. The embodiment of FIG. 11 is similar to that in FIG. 9 except for the following aspects. In the embodiment of FIG. 11, a capacitor network 87 is used instead of the capacitor network 86 of FIG. 9 and an inverter 88 is interposed between the transistors T11 to T14 and the respective outputs Q1 to Q4 in the first control circuit 82. In the embodiment of FIG. 11, the capacitance of the integration circuit 322 in the quenching oscillator 32 is varied to reach finally its optimum value. The term "collector capacitance" of the transistor T2 used herein means the capacitance of a selected one or ones capacitances C21 to C24 in the capacitor network 87 which is connected to the capacitor C6 of the integration circuit 322. The relationship between the collector capacitance and the sensitivity of the receiver 1 is depicted in FIG. 12. The optimum collector capacitance is CC1 in FIG. 12 and is set up by the capacitor network 87 or the control circuit 8 in the embodiment of FIG. 11. The reason for selection of the optimum capacitance is to modify the RC time constant of the integration circit 322. To this end the capacitors C21 to C24 in the capacitor network 87 may be replaced with resistors (not shown).

Figure 14:
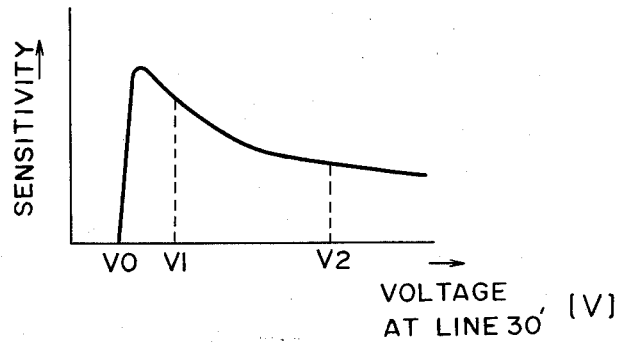
FIG. 14 is a graph showing operation of the circuit shown in FIG. 13, wherein sensitivity is plotted against power supply voltage.

FIG. 13 illustrates a circuit diagram of another embodiment of the present invention. This embodiment as in FIG. 13 is adapted to control a power supply voltage from the power line 30 to the quenching oscillator 32, while the base voltage of the transistor T2 is controlled in the embodiment of FIG. 6. For this reason the control circuit 8 includes a resistor network 89 which in turn comprises four resistors R21 to R24, for example. One terminal of each of these resistors R21 to R24 is connected to a respective one of the outputs Q1 to Q4 of the first control circuit 82, with the other terminal thereof being commonly connected to the base of a transistor T4. The transistor T4 has its collector connected to the power line 30 and its emitter connected to a second power line 30'. One terminal of the resistor R1 which forms the integration circuit 322 is also led to the second power line 30'. A base bias voltage is fed to the transistor T2 through the second power line 30'. The relationship between power supply voltage V and the sensitivity of the receiver 1 is depicted in FIG. 14 wherein V is the voltage at the second power line 30' or the power supply voltage to the quenching oscillator 32. FIG. 14 indicates that V1 is the optimum voltage value at the second power line 30'. The control circuit 8 operates to seek the optimum voltage value V1 in the same manner as in the embodiment of FIG. 6. Details of operation of the control circuit 8 in FIG. 13 need not be discussed in the specification.

The embodiment of FIG. 13 is adapted such that the second control circuit 83 operates according to the output of the oscillation stop detector 9 or the output of the latch circuit 11. However, the control circuit 83 may start operating upon the beginning of the oscillation performance of the quenching oscillator while the first control circuit 82 varies the oscillation condition of the quenching oscillator 32.

For example, in the above embodiment of FIG. 13, the first control circuit 82 varies the base voltage in the order of VB2→VB1→VB0→VB1 and eventually attains the optimum base voltage. It is to be understood that the order of variations in the base voltage should not be limited thereto. As an alternative provided that the quenching oscillator 32 continues oscillating at the base voltage VB2, a first voltage value may be determined intermediate VB0 as expected and VB2. Should the quenching oscillator 32 still continue oscillating at the moment when the first intermediate voltage value is established, a second voltage value will be created intermediate the first intermediate voltage and VB0 as expected. Furthermore, provided that the quenching oscillator 32 still continues oscillating at the second intermediate voltage value, a third voltage value will be established between the second intermediate voltage value and VB0 as expected. If the quenching oscillator 32 discontinues oscillating at any of the above intermediate voltage values, there will be established yet another intermediate voltage value between that intermediate voltage values where the oscillator discontinues and the previous one of the intermediate voltage values. In the case that the optimum base voltage is determined in this manner, the number of such determination steps necessary for achieving the optimum voltage value is smaller than that in the previous embodiments where the optimum voltage value is determined through sequential selection.

While in the above embodiments the quenching oscillator 32 has been illustrated and described as the self-excited type, this may be the separately excited type. In this case, the transistor to which the output of the oscillator is supplied will correspond to the transistors T2 in the above embodiments. It is further obvious to those skilled in the art that the transistor T2 may be implemented with a well-known PNP type and a well-known field effect transistor in addition to the NPN type shown in the above embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A superregenerative receiver comprising:

quenching oscillator means for converting a received signal into a low frequency signal, the efficiency of said quenching oscillator means being altered by at least one operating parameter;

operating voltage supply means including a power supply voltage source for supplying said quenching oscillator means with an operating voltage, said operating parameter being said operating voltage;

oscillation condition modification means for modifying said operating voltage supplied to said quenching oscillator means; and control means responsive to a control output of said quenching oscillator means and including optimum operating voltage setting means for controlling the modification of said operating voltage by said oscillation condition modification means so as to establish an optimum operating voltage for maximizing the efficiency of said quenching oscillator means by placing said oscillator means into an optimum oscillation condition;

said operating condition modification means being responsive to said control means to digitally vary said operating voltage in a first direction until operation of said quenching oscillator means ceases, said operating condition modification means varying said operating voltage in a direction opposite said first direction by a predetermined amount to establish said optimum operating condition.

2. A superregenerative receiver in accordance with claim 1, wherein said control means includes oscillation stop detector means responsive to the output of said quenching oscillator means for determining if said quenching oscillator means discontinue oscillating and, the remainder of said control means is adapted to be responsive to the output of said oscillation stop detector means for establishing said optimum oscillation condition.

3. The superregenerative receiver of claim 1 wherein said quenching oscillator means includes a gain element.

4. A superregenerative receiver comprising:

quenching oscillator means for converting a received signal into a low frequency signal, said quenching oscillator means including a resonant circuit including at least a resistor, inductor or capacitor, oscillation condition modification means for modifying the value of one of said resistor, inductor or capacitor to vary the efficiency of said quenching oscillator means;

control means responsive to a control output of said quenching oscillator means for controlling said oscillation condition modification means in order to optimize the value of one of said resistor, inductor or capacitor in order to maximize the efficiency of said quenching oscillator means by placing said oscillator means into an optimum oscillation condition;

said oscillation condition modification means being responsive to said control means to digitally vary said value in a first direction until the operation of said quenching oscillation means ceases, said oscillation condition modification means varying said value in a direction opposite said first direction by a predetermined amount to establish said optimum operating condition.

5. A superregenerative receiver in accordance with claim 4, wherein said resonant circuit includes an RC time constant circuit having a capacitance component and a resistance component, said modification means includes means for modifying the value of at least one of said capacitance component and said resistance component, and said control means includes means for optimizing the value of at least one of said capacitance component and said resistance component.

6. A superregenerative receiver in accordance with claim 1 or 4, which further comprises means for providing a command to said oscillation condition modification means to activate said oscillation condition modification means.

7. A superregenerative receiver in accordance with claim 6, wherein said command providing means includes manually operable switching means.

8. A superregenerative receiver comprising:

quenching oscillator means for converting a received signal into a low frequency signal, said quenching oscillator means including a transistor, oscillation condition modification means for modifying at least one parameter of said transistor to vary the efficiency of said quenching oscillator means;

control means responsive to a control output of said quenching oscillator means for controlling said oscillation condition modification means in order to optimize said transistor parameter in order to maximize the efficiency of said quenching oscillator means by placing said oscillator means into an optimum oscillation condition, said oscillation condition modification means being responsive to said control means to digitally vary said parameter in a first direction until the operation of said quenching oscillation means ceases, said oscillation condition modification means varying said parameter in a direction opposite said first direction by a predetermined amount to establish said optimum operating condition.

9. A superregenerative receiver in accordance with claim 8, wherein said parameter includes a base voltage supplied to the base of said transistor.

* * * * *